(12) United States Patent
Loiselet

(10) Patent No.: US 8,383,462 B2
(45) Date of Patent: Feb. 26, 2013

(54) METHOD OF FABRICATING AN INTEGRATED CIRCUIT PACKAGE

(75) Inventor: Emmanuel Loiselet, Elancourt (FR)

(73) Assignee: Thales Holdings UK PLC, Surrey (GB)

( * ) Notice: Subject to any disclaimer, the term of this patent is extended or adjusted under 35 U.S.C. 154(b) by 199 days.

(21) Appl. No.: 13/009,949

(22) Filed: Jan. 20, 2011

(65) Prior Publication Data
US 2011/0180921 A1    Jul. 28, 2011

(30) Foreign Application Priority Data
Jan. 27, 2010   (GB) .................................. 1001341.5

(51) Int. Cl.
*H01L 21/00*   (2006.01)
*H01L 23/12*   (2006.01)

(52) U.S. Cl. ......... 438/125; 257/704; 257/772; 257/774

(58) Field of Classification Search .................. None
See application file for complete search history.

(56) References Cited

U.S. PATENT DOCUMENTS

| | | | |
|---|---|---|---|
| 5,219,794 A | 6/1993 | Satoh et al. | |
| 6,433,412 B2 * | 8/2002 | Ando et al. | 257/678 |
| 6,603,183 B1 * | 8/2003 | Hoffman | 257/434 |
| 6,856,015 B1 * | 2/2005 | Huang et al. | 257/706 |
| 7,196,414 B2 * | 3/2007 | Lin et al. | 257/707 |
| 8,084,297 B1 * | 12/2011 | Joshi et al. | 438/106 |
| 8,178,936 B2 * | 5/2012 | Zhe et al. | 257/416 |
| 2002/0113306 A1 * | 8/2002 | Kwon et al. | 257/691 |

FOREIGN PATENT DOCUMENTS

| | | | |
|---|---|---|---|
| JP | 01021945 A | 1/1989 | |
| JP | 08141745 A | 6/1996 | |

OTHER PUBLICATIONS

Search Report in GB1001341.5 dated Jun. 22, 2010.

* cited by examiner

*Primary Examiner* — Alonzo Chambliss
(74) *Attorney, Agent, or Firm* — Stroock & Stroock & Lavan LLP

(57) ABSTRACT

A method of manufacturing a ball grid array, BGA, integrated circuit package, comprising forming a double sided printed circuit board, PCB, with blind vias interconnecting electrically the circuits on the opposed surfaces of the PCB, with at least one through-hole to allow fluid or gas to pass through the PCB, and an integrated circuit connected to the printed circuit on one side of the PCB; soldering a lid onto the said one side of the PCB to enclose the integrated circuit, whilst allowing thermally expanding gas or fluid to escape through the or each through-hole, whereby to form a package which is hermetically sealed except for the or each through-hole, and which has a cavity between the integrated circuit and the lid; applying a BGA to the side of the PCB opposed to the said one side, whereby to solder the balls of the BGA to respective portions of the printed circuit and to align one of the balls axially with each through-hole; and soldering the ball or balls into the through-hole, or into each respective through-hole, to hermetically seal the package.

12 Claims, 1 Drawing Sheet

METHOD OF FABRICATING AN INTEGRATED CIRCUIT PACKAGE

This application claims the benefit of United Kingdom Patent Application No. 1001341.5, filed Jan. 27, 2010, the entire content of which is expressly incorporated herein by reference.

This invention relates to an integrated circuit package in which an integrated circuit on a printed circuit board, PCB, is enclosed by a lid, leaving an air or gas filled cavity around the integrated circuit. In particular, the package is of the type that has a solder ball grid array, BGA, connected to the exterior surface of the PCB, for forming electrical connections by soldering balls to another component such as a mother board. The invention also relates to a method of manufacturing such a ball grid array integrated circuit package.

One known BGA integrated circuit package comprises a double sided printed circuit board on one side of which is connected a silicon die constituting the integrated circuit, and on the other side of which is connected the ball grid array. Plated through-holes are used in the PCB to interconnect the printed circuit patterns on its sides. The silicon die is fully enclosed in an overmoulded epoxy lid, without any cavity.

Another known type of BGA integrated circuit package has an air cavity around the integrated circuit, and a lid which is glued onto the PCB around its periphery. The printed circuit patterns on the opposite sides of the PCB are interconnected by plated vias which are necessarily blind (or filled), in order to preserve the hermeticity of the package.

None of the existing BGA packages, of which the applicant is aware, is sufficiently robust and sufficiently well hermetically sealed for use in some demanding applications such as the transmission and receiving modules which are part of an active array antenna and operate at microwave radio frequency. For such applications that require reliable, long term radio frequency performance at microwave frequencies, a more reliable method of sealing the package is required. By way of example, the frequency of operation could be in the X, Ku, K and Ka bands.

The integrated circuits may for example be silicon, Silicon Germanium or gallium arsenide or gallium nitride dies which need to be protected from external environmental influences which could cause corrosion, mould ingress and so on. The problem with the overmoulded epoxy lids is that the resin can absorb water or can de-gas, affecting its dielectric characteristics over time. For RF applications, a gas filled cavity around the chip is more reliable, and is more likely to minimise deviation in RF performance over time. The purpose of the present invention is to provide a package with a cavity between a lid and the integrated circuit, which satisfies these requirements for hermeticity and consistent performance over time.

Accordingly, the present invention provides a method of manufacturing a ball grid array, BGA, integrated circuit package, comprising forming a double sided printed circuit board, PCB, with blind vias interconnecting electrically the circuits on the opposed surfaces of the PCB, with at least one through-hole to allow fluid or gas to pass through the PCB, and an integrated circuit connected to the printed circuit on one side of the PCB; soldering a lid onto the said one side of the PCB to enclose the integrated circuit, whilst allowing thermally expanding gas or fluid to escape through the or each through-hole, whereby to form a package which is hermetically sealed except for the or each through-hole, and which has a cavity between the integrated circuit and the lid; applying a BGA to the side of the PCB opposed to the said one side, whereby to solder the balls of the BGA to respective portions of the printed circuit and to align one of the balls axially with each through-hole; and soldering the ball or balls into the through-hole, or into each respective through-hole, to hermetically seal the package.

The invention also provides a BGA, ball grid array, integrated circuit package comprising an integrated circuit connected to a double-sided PCB on one side and hermetically enclosed on that side by a lid with a cavity between the integrated circuit and the lid, and connected electrically to a BGA on the opposite side of the PCB, the periphery of the lid being soldered to the PCB such that the layer of solder therebetween is substantially without voids.

The invention allows a reliable solder joint to form the joint between the lid and the PCB, satisfying the requirements for robustness and hermeticity. Without the ability of the cavity to breathe through the through-hole during the assembly process of the lid, an excess pressure would form between the inside and the outside across the solder joint, during the soldering process, caused by thermal expansion of the gas or fluid in the cavity. Air expansion during solder reflow would cause the lid to go up and down and to move laterally when the micro-bubbles escape the air cavity through the solder joint, and this could affect the hermeticity of the package and the quality of the solder joint, i.e. its mechanical reliability.

The gas would bubble through the fused solder, leaving voids in the solidified joint. The invention further exploits the availability of a ball of the ball grid array to use for closing the through-hole once the lid has been soldered onto the PCB. Generally, there are many redundant balls in a BGA, and one or more of these balls can be used to close and hermetically seal the through-hole or through-holes during manufacture.

In order that the invention may be better understood, two preferred embodiments will now be described, by way of example, with reference to the accompanying schematic drawings, in which.

A method embodying the invention will now be described.

Figure 1:
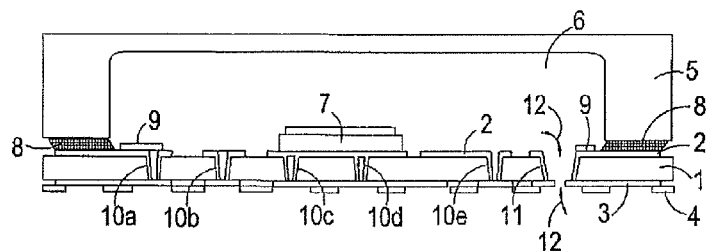
FIG. 1 is a cross section through the centre of an integrated circuit package during manufacture in accordance with the present invention, showing an open through-hole used as a breather hole.

With reference to FIG. 1, a PCB 1 is formed with printed circuits 2, 3 on its opposite sides. In this example, the printed circuits are of gold plated copper, although Palladium is an alternative to gold. Blind vias 10a, 10b, 10c, 10d and 10e are shown, and are plated so as to form contacts between the opposed printed circuits. An integrated circuit 7 is connected to the printed circuit 2, usually on pads with exposed bond wires (not shown). A periphery of the PCB 1 is further coated with a solder resistant mask layer 9 to ensure that the solder paste (before it creates the solder joint 8) consisting of small solder balls in a resin paste stays under the lid during the lid soldering process. Correspondingly, a solder resistant mask layer 4 is there to ensure that the solder flux, and optionally the solder paste, is formed on the pads on the opposite side of the PCB. An open through-hole 11 provides a breathing opening through the PCB, to keep the pressure in the cavity 6 the same as that of the exterior. Possible fluid movement is illustrated by the arrows 12 in FIG. 1.

By way of example, the thin solder paste deposit 8 may be made with a paste dispenser using a stencil or a silk screen system.

A lid 5, usually rectangular in shape, has a flat base and an edge depending from the base, as shown in FIG. 1. The lid 5 is located onto the PCB 1 using a pick-and-place machine. Thus the lid rests over the coating of solder paste 8. The assembly then passes through a reflow oven to melt the paste to form the solder joint 8. During the soldering process, the temperature inside the cavity 6 increases causing the air or other fluid to expand, and to exit through the through-hole 11. When the solder liquidus phase is achieved, there is a seal between the lid and the PCB, but the air or other fluid can still escape through the through-hole 11.

The same breather hole 11 may then be used to clean the gas trapped inside the cavity 6 during the soldering process. Moreover, the hole can be used to back-fill the cavity 6 with an inert gas such as nitrogen or helium.

Figure 2A:
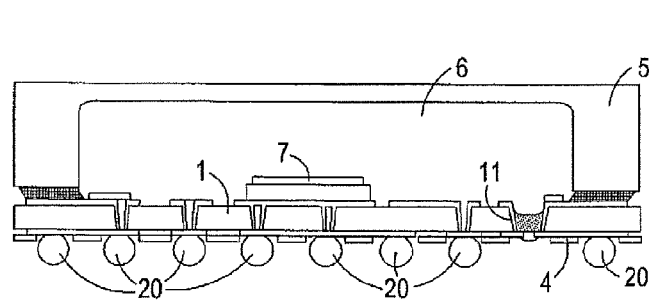
FIG. 2a is a cross sectional view corresponding to FIG. 1, after the through-hole has been sealed with one of the balls of the BGA.
Figure 3A:
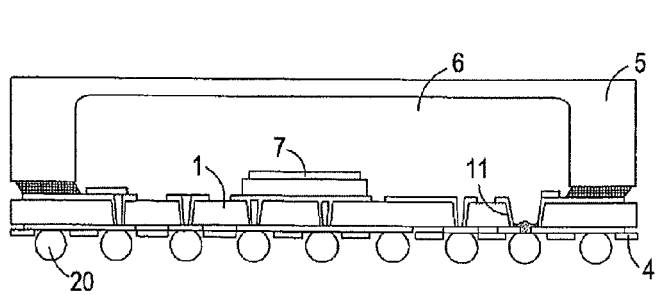
FIGS. 3a and 3b are views corresponding respectively to FIGS. 2a and 2b showing an alternative use of one of the balls of the BGA to seal a through-hole.

The package is then fully hermetically sealed simultaneously with the application of a ball grid array, BGA 20, as shown in FIGS. 2a and 3a. As is conventional, the ball grid array is lowered onto the PCB 1, with an inverted orientation from that shown in the drawings. Sufficient heat is applied to the BGA to cause the balls 20 to be soldered onto the corresponding portions of the printed circuit 3, using the solder flux and optionally the solder paste. At the same time, one of the redundant balls of the BGA is aligned axially with the through-hole 11, and serves to seal the through-hole permanently. Since this ball is redundant, it is inconsequential whether it remains level with the other balls of the BGA.

Figure 2B:
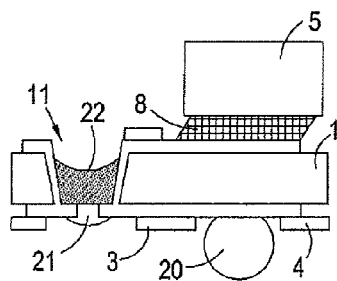
FIG. 2b is an enlarged view of part of FIG. 2a illustrating the sealed through-hole.

In a first embodiment, shown in FIGS. 2a and 2b, the balls of the BGA are eutectic tin-lead, with a stoichiometric ratio of Sn63/Pb37, i.e. 63% tin and 37% lead. This mixture has a melting point of about 183° C. Flux is spread onto the printed circuit 3 on the underside of the PCB and the solder balls are positioned onto the flux deposit, which is in the gaps in the mask layer 4. When the balls melt, they will stay in place because of the solder resistant mask layer 4 which creates a barrier through surface tension.

Sufficient thermal energy is applied to the ball aligned with the through-hole 11 to cause it to fuse and to drop into the through-hole substantially to fill the through-hole by forming a solid plug 22 as shown in FIG. 2b. In this example, a portion of the original solder ball 21 remains in the form of a cap, plugging the hole through the copper printed circuit layer 3 and also projecting from that layer. The plug formed by the portions 21 and 22 of the solder ball has the same function as a rivet but is fused also to the wall of the through-hole which was previously plated with copper. This forms a robust hermetic seal.

Optionally there may be more than one through-hole 11, in which case a corresponding number of redundant solder balls of the BGA is employed to seal them after the lid has been soldered in place.

The through-hole 11 could optionally be used to form an electrical connection, but it is not envisaged that this would be necessary in any device.

It is envisaged that if the through-hole 11 were substantially narrower than the diameter of the ball, which is typically 0.4 mm, there may be capillary action on the fused ball, drawing the solder of the ball completely through the PCB 1 and spilling out around the edge over the printed circuit layer 2, which would be undesirable. Accordingly, the internal diameter of the through-hole 11 is selected appropriately. In this example, the through hole 11 is conical, tapering inwardly from the interior to the exterior of the package. Its average internal diameter in this example is 0.6 mm, i.e. 50% greater than the diameter of the ball. The preferred range of internal diameter of the through-hole, on average, is likely to be 50%-200% of the ball diameter. Clearly, it is not necessary for the material of the ball completely to fill the through-hole, provided that the depth from the printed circuit layer 3 into the through-hole is sufficient to form a substantial plug.

Preferably, the printed circuit layers 2 and 3 are formed with a gold surface layer, which then forms a compound with the solder material of the ball. This gold compound interface will have a melting point higher than that of the BGA balls, so as to stabilise the new structure.

BGA balls of different diameters may be employed, depending upon the specific application required. Some may have a diameter for example of 0.5 mm.

Figure 3B:
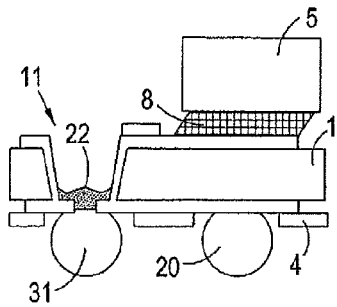

In the second embodiment of the invention illustrated in FIGS. 3a and 3b, the method of manufacture is essentially the same as that described above, except that the balls are substantially non-fusible at soldering temperatures. In this example, the balls are of 90% lead and 10% tin i.e. Pb90/Sn10, This makes it necessary to use a layer of solder paste in the gaps in the mask layer 4. The solder balls are positioned onto the solder paste deposit, and they are retained through surface tension by the solder resistant mask layer 4. As shown most clearly in FIG. 3b, as the BGA is applied to the PCB and is heated, typically to about 200° C., which is substantially below the melting point of the balls at 320° C., the solder paste fuses and flows into the through-hole 11. Part of the ball 31 also is drawn into the through-hole 11, and the solder paste as well as the ball 31 form a plug 32 which is integral with the remainder of the ball 31.

In each of the embodiments described above with reference to FIGS. 2a and 3a, the diameter of the circular hole in the printed circuit pattern 3 is approximately 0.2 mm, i.e. substantially less than the diameter of the ball which may be 0.4 mm or 0.5 mm. This allows the edges of the hole in the layer 3 to support the solder paste and/or solder flux layer 4. It also stops the ball dropping through the through-hole during this application process. Precise holes may be formed in the copper layer for example using YAG laser ablation.

Although not illustrated in the drawings, the solder paste surrounds the balls and solidifies around them, with a meniscus.

Once the BGA has been applied to the PCB to form the hermetically sealed package, it may be connected to another board (not shown) or another component. This requires re-heating of the BGA, but the solder holding the balls onto the package and sealing the through-hole 11 should not re-melt, since the interface is a tin-lead-gold compound with a higher melting point, as described above.

The process of this invention adds little in cost to conventional manufacturing processes, and is compatible with PCB mass production facilities. It allows the package to be free of aggressive gas, which may have formed during lid assembly, by de-gassing it and filling it with a neutral gas before the balling process. The invention provides a reliable solder joint for the lid, and a high level of hermeticity overall. It is suitable for packages requiring high stress and thermal environmental exposure, such as for military aircraft specifications.

In this example, the thickness of the PCB 1 is not less than a third of the diameter of a BGA ball, and not more than its diameter. The average diameter of the through-hole in the PCB 1 is approximately 150% of the ball diameter, and the diameter of the hole through the printed circuit layer 3 is approximately 50% of the ball diameter.

A package formed in accordance with the invention, with a substrate size of 9.3×8.3 mm, was tested for hermeticity with a pressure difference of 1 bar between the cavity 6 and the exterior, and the leakage rate of air was found to be less than $6\times10^{-6}$ Atm cm$^3$/second of air, and even less than $7\times10^{-7}$ Atm cm$^3$ per second of air. This low leakage rate applied to packages formed according to the first embodiment and also the second embodiment of the invention described above, i.e. with eutectic tin-lead and also with non-fusible tin-lead balls of 0.4 mm (400 micron) diameter. Such leakage rates are attributable to leakage through the PCB itself, rather than through the solder joint 8 of the lid, which would have a negligible leakage rate. Compared with prior manufacturing techniques, this improvement in hermeticity is of the order of $10^{-4}$.

The invention claimed is:

1. A method of manufacturing a ball grid array, BGA, integrated circuit package, comprising forming a double sided printed circuit board, PCB, with blind vias interconnecting electrically the circuits on the opposed surfaces of the PCB, with at least one through-hole to allow fluid or gas to pass through the PCB, and an integrated circuit connected to the printed circuit on one side of the PCB; soldering a lid onto the said one side of the PCB to enclose the integrated circuit, whilst allowing thermally expanding gas or fluid to escape through the or each through-hole, whereby to form a package which is hermetically sealed except for the or each through-hole, and which has a cavity between the integrated circuit and the lid; applying a BGA to the side of the PCB opposed to the said one side, whereby to solder the balls of the BGA to respective portions of the printed circuit and to align one of the balls axially with each through-hole; and soldering the ball or balls into the through-hole, or into each respective through-hole, to hermetically seal the package.

2. A method according to claim 1, comprising applying a layer of solder paste to the said opposite side of the PCB before applying the BGA soldering balls, and then heating the BGA sufficiently to cause the solder paste to be drawn partially into the or each through-hole to close it and to form a solder joint with the respective ball of the BGA.

3. A method according to claim 2, comprising causing a portion of the ball of the BGA to be fused and drawn in to the through-hole adjacent the solder paste.

4. A method according to claim 1, comprising fusing the ball of the BGA that is aligned with the through-hole sufficiently to cause it to flow into the through-hole to seal it hermetically.

5. A method according to claim 1, comprising applying a layer of solder flux to the printed circuit on the said opposite side of the PCB before applying the BGA soldering balls.

6. A method according to claim 1, comprising degassing the interior of the package by extracting fluid or gas through the through-hole or through-holes prior to the step of sealing them with the BGA soldering balls.

7. A method according to claim 1, in which the BGA comprises eutectic tin-lead balls with a stoichiometry of substantially Pb37/Sn63.

8. A method according to claim 1, in which the BGA comprises tin-lead balls with a stoichiometry of substantially Pb90/Sn10.

9. A method according to claim 1, wherein the printed circuit is coated with a layer of Gold or Palladium and the BGA balls combine with the Gold or Palladium during the soldering process to create a Gold or Palladium compound interface with a melting point higher than that of the BGA balls.

10. A method according to claim 1, wherein the through-hole comprises a circular opening through the printed circuit layer on the said opposite side of the PCB, this hole having a diameter substantially less than the diameter of the ball of the BGA.

11. A method according to claim 1, in which the average internal diameter of the through-hole is greater than the diameter of the ball of the BGA.

12. A method according to claim 1, in which the through-holes are conical and taper inwardly from the said one side to the said opposite side of the PCB.

* * * * *